(12) United States Patent
Mizusawa

(10) Patent No.: US 10,734,220 B2
(45) Date of Patent: Aug. 4, 2020

(54) METHOD FOR MANUFACTURING SILICON EPITAXIAL WAFER AND METHOD FOR MANUFACTURING SEMICONDUCTOR DEVICE

(71) Applicant: SHIN-ETSU HANDOTAI CO., LTD., Tokyo (JP)

(72) Inventor: Yasushi Mizusawa, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 16 days.

(21) Appl. No.: 16/326,832

(22) PCT Filed: Aug. 17, 2017

(86) PCT No.: PCT/JP2017/029484
§ 371 (c)(1),
(2) Date: Feb. 20, 2019

(87) PCT Pub. No.: WO2018/047595
PCT Pub. Date: Mar. 15, 2018

(65) Prior Publication Data
US 2019/0228962 A1 Jul. 25, 2019

(30) Foreign Application Priority Data
Sep. 7, 2016 (JP) ................................. 2016-174640

(51) Int. Cl.
*H01L 21/02* (2006.01)
*H01L 27/115* (2017.01)
*H01L 21/66* (2006.01)

(52) U.S. Cl.
CPC ........ *H01L 21/022* (2013.01); *H01L 21/0217* (2013.01); *H01L 21/0245* (2013.01);
(Continued)

(58) Field of Classification Search
None
See application file for complete search history.

(56) References Cited

U.S. PATENT DOCUMENTS

| 4,830,984 A | * | 5/1989 | Purdes | ............ H01L 21/02381 117/106 |
| 2010/0078622 A1 | | 4/2010 | Yoshimizu et al. | |

(Continued)

FOREIGN PATENT DOCUMENTS

| JP | H06-112120 A | 4/1994 |
| JP | H07-249573 A | 9/1995 |

(Continued)

OTHER PUBLICATIONS

Sep. 26, 2017 International Search Report issued in International Patent Application No. PCT/JP2017/029484.
(Continued)

*Primary Examiner* — Andres Munoz
(74) *Attorney, Agent, or Firm* — Oliff PLC

(57) ABSTRACT

A method for manufacturing a silicon epitaxial wafer includes: preparing a test silicon wafer in advance, forming the multilayer film on a surface of the test silicon wafer, and measuring a warp direction and a warp amount (Warp) W of the silicon wafer having the multilayer film formed thereon; and selecting a silicon wafer as a device formation substrate and conditions for forming an epitaxial layer which is formed on the silicon wafer as the device formation substrate in such a manner that a warp which cancels out the measured warp amount W is formed in a direction opposite to the measured warp direction, and forming the epitaxial layer on a surface of the selected silicon wafer as the device formation substrate where the multilayer film is formed under the selected conditions for forming the epitaxial layer.

16 Claims, 5 Drawing Sheets

(52) U.S. Cl.
CPC .. *H01L 21/02164* (2013.01); *H01L 21/02271* (2013.01); *H01L 21/02304* (2013.01); *H01L 21/02381* (2013.01); *H01L 21/02532* (2013.01); *H01L 21/02595* (2013.01); *H01L 22/12* (2013.01); *H01L 22/20* (2013.01); *H01L 22/30* (2013.01); *H01L 21/02488* (2013.01); *H01L 21/02507* (2013.01); *H01L 27/115* (2013.01)

(56) References Cited

U.S. PATENT DOCUMENTS

2013/0178066 A1    7/2013  Cho et al.
2015/0371909 A1*  12/2015  Bhagavat ............... H01L 22/20
                                                      438/5

FOREIGN PATENT DOCUMENTS

| JP | 2009-302163 A | 12/2009 |
| JP | 2010-080685 A | 4/2010 |
| JP | 2010-118487 A | 5/2010 |
| JP | 2014-179656 A | 9/2014 |

OTHER PUBLICATIONS

Mar. 12, 2019 International Preliminary Report on Patentability issued in International Patent Application No. PCT/JP2017/029484.
Oct. 8, 2019 Office Action issued in Japanese Patent Application No. 2016-174640.

* cited by examiner

METHOD FOR MANUFACTURING SILICON EPITAXIAL WAFER AND METHOD FOR MANUFACTURING SEMICONDUCTOR DEVICE

TECHNICAL FIELD

The present invention relates to a method for manufacturing a silicon epitaxial wafer and a method for manufacturing a semiconductor device.

BACKGROUND ART

As a substrate to fabricate a semiconductor integrated circuit, a silicon wafer fabricated by a CZ (Czochralski) method is mainly used. In each of recent advanced memory devices, a NAND flash memory having a three dimensional structure which has a process of laminating a multilayer film on a silicon wafer to increase a capacity and reduce a bit cost is used. A relatively initial stage of the process has a step of laminating tens of pairs of "$SiO_2$+SiN" films. After the lamination, there are many three-dimensional complicated steps, e.g., a hole etching step of colmunarly etching members including a substrate, a step of forming a film of polysilicon on a sidewall, a step of etching SiN, and an electrode forming step, and performing each step in a state where the wafer largely warps can cause a failure.

Claim 8 in Patent Literature 1 has a description that a thin film is formed on one main surface of a substrate in a state where the substrate is warped in an opposite direction. However, according to the prior art, etching is performed for warping. In control over a warp amount provided by the etching, an etching rate must be fixed in a concentric shape, and forming a concentric warp shape which cancels out a warp provided by film formation is difficult.

Further, Patent Literature 2 has a description that a warp of an epitaxial wafer is identified in advance, a direction of a warp of a substrate is aligned to a direction opposite to a direction of a warp change which occurs in epitaxial wafer growth, and an absolute value of a warp of the epitaxial silicon wafer is reduced. According to the prior art, an object is to reduce a warp caused due to a lattice mismatch by selecting a concave or convex shape of a silicon wafer which is used for the substrate, but reducing a warp amount (Warp) whose size is hundreds of μm is difficult.

CITATION LIST

Patent Literatures

Patent Literature 1: JP2009-302163A
Patent Literature 2: JPH6-112120A

SUMMARY OF INVENTION

Technical Problem

FIG. 2 is a schematic view showing a state where a multilayer film is laminated on a silicon wafer (a silicon substrate) in a process of a 3D-NAND device. In a silicon wafer 1 having a multilayer film laminated thereon, $SiO_2$ films 3 and SiN films or polysilicon films 4 are alternately laminated in the mentioned order on a silicon wafer (a silicon substrate) 2, and a multilayer film 6 provided by laminating a plurality of a pair of "$SiO_2$+SiN" films or "$SiO_2$+polysilicon" films 5 each pair of which is formed of the $SiO_2$ film 3 and the SiN film or the polysilicon film 4 is laminated (formed). It is to be noted that, in a portion surrounded by a square of a dotted line in FIG. 2, some of the plurality of laminated pairs of "$SiO_2$+SiN" films or "$SiO_2$+polysilicon" films 5 are omitted.

As described above, the process of the 3D-NAND device, a step of depositing many thin films such as "$SiO_2$+SiN" films or "$SiO_2$+polysilicon" films is present in a process initial state.

At this step, it has been known that the wafer largely warps due to a film thickness of each thin film, a difference in linear expansion coefficient between Si which is the substrate and a film material, intrinsic stress at the time of film formation, and others. Subsequent processes are carried out in a state where the warp is considerable, which can cause a device failure.

To solve the problem, it is an object of the present invention to provide a method for manufacturing a silicon epitaxial wafer which enables manufacturing the silicon epitaxial wafer whose warp caused in formation of multilayer films is reduced.

Solution to Problem

To solve the problem, in the present invention, there is provided a method for manufacturing a silicon epitaxial wafer which is constituted of a silicon wafer and an epitaxial layer formed on the silicon wafer, the silicon epitaxial wafer being configured to form a multilayer film on the epitaxial layer comprising:

preparing a test silicon wafer in advance, forming the multilayer film on a surface of the test silicon wafer, and measuring a warp direction and a warp amount (Warp) W of the silicon wafer having the multilayer film formed thereon; and selecting a silicon wafer as a device formation substrate and conditions for forming an epitaxial layer which is formed on the silicon wafer as the device formation substrate in such a manner that a warp which cancels out the measured warp amount W is formed in a direction opposite to the measured warp direction, and forming the epitaxial layer on a surface of the selected silicon wafer as the device formation substrate where the multilayer film is formed under the selected conditions for forming the epitaxial layer.

According to such a method for manufacturing a silicon epitaxial wafer, it is possible to manufacture the silicon epitaxial wafer whose warp caused in formation of the multilayer films can be reduced.

At this time, it is preferable that, at the step of forming the epitaxial layer, a silicon wafer having germanium or tin doped therein is used as the silicon wafer which is the device formation substrate in case of forming a concave warp which recesses the epitaxial layer side to the silicon epitaxial wafer, and a silicon wafer having phosphorus or boron doped therein is used as the silicon wafer which is the device formation substrate in case of forming a convex warp which protrudes the epitaxial layer side to the silicon epitaxial wafer.

In the manufacturing method according to the present invention, it is possible to select the silicon wafer which is the device formation substrate by such a method, for example.

Further, at this time, it is preferable that, at the step of forming the epitaxial layer, the conditions for the silicon wafer as the device formation substrate and the conditions for forming the epitaxial layer are determined by the following expression in such a manner that a warp amount of the warp formed to the silicon epitaxial wafer becomes the warp amount W (in this regard, W is a positive value in case of forming the concave shape which recesses the multilayer film side to the silicon wafer having the multilayer film formed thereon, and W is a negative value in case of forming the convex warp which protrudes the multilayer film side to the silicon wafer having the multilayer film formed thereon):

$$W=\{(3\times l^2 \times h_f)/(4\times h_S^2)\}\times\{(r_{Si}-r_X)/r_{Si}\}\times[X]/N_S$$

where l: a diameter of the silicon wafer as the device formation substrate, $h_f$: a thickness of the epitaxial layer, $h_S$: a thickness of the silicon wafer as the device formation substrate, $r_{Si}$: a covalent radius of Si, $r_X$: a covalent radius of an element which is doped in the silicon wafer as the device formation substrate, $N_S$: atomic density of Si, and

[X]: dope concentration of the element which is doped in the silicon wafer as the device formation substrate.

In the present invention, it is possible to determine the conditions for the silicon wafer as the device formation substrate and the conditions for forming the epitaxial layer by such a method, for example.

Furthermore, at this time, it is preferable for the multilayer film to be a multilayer film provided by alternately laminating an $SiO_2$ film and an SiN film or a multilayer film provided by alternately laminating the $SiO_2$ film and a polysilicon film.

In the method for manufacturing a silicon epitaxial wafer according to the present invention, as the multilayer film, it is possible to use the multilayer film provided by alternately laminating the $SiO_2$ film and the SiN film or the multilayer film provided by alternately laminating the $SiO_2$ film and the polysilicon film.

Moreover, according to the present invention, there is provided a method for manufacturing a semiconductor device, the method including forming the multilayer film on a surface of a silicon epitaxial wafer, which is manufactured by the method for manufacturing a silicon epitaxial wafer, where the epitaxial layer has been formed.

According to the method for manufacturing a semiconductor device of the present invention, since it is possible to reduce a warp caused when the multilayer film is formed on the surface of the silicon epitaxial wafer where the epitaxial layer has been formed, subsequent processes are carried out in a state where the warp is small, and hence a semiconductor device can be manufactured without causing a device failure.

Advantageous Effects of Invention

According to the method for manufacturing a silicon epitaxial wafer of the present invention, it is possible to manufacture a silicon epitaxial wafer whose warp caused in formation of a multilayer film can be reduced. Additionally, according to the method for manufacturing a semiconductor device, since it is possible to reduce a warp caused in formation of a multilayer film on a surface of a silicon epitaxial wafer where an epitaxial layer has been formed, subsequent processes are carried out in a state where the warp is small, and hence a semiconductor device can be manufactured without causing a device failure.

DESCRIPTION OF EMBODIMENTS

The present invention will now be described hereinafter in detail with reference to the drawings, but the present invention is not restricted thereto.

The present invention provides a method for manufacturing a silicon epitaxial wafer which is constituted of a silicon wafer and an epitaxial layer formed on the silicon wafer, the silicon epitaxial wafer being configured to form a multilayer film on the epitaxial layer. The method for manufacturing a silicon epitaxial wafer according to the present invention includes: preparing a test silicon wafer in advance, forming the multilayer film on a surface of the test silicon wafer, and measuring a warp direction and a warp amount (Warp) W of the silicon wafer having the multilayer film formed thereon; and selecting a silicon wafer as a device formation substrate and conditions for forming an epitaxial layer which is formed on the silicon wafer as the device formation substrate in such a manner that a warp which cancels out the measured warp amount W is formed in a direction opposite to the measured warp direction, and forming the epitaxial layer on a surface of the selected silicon wafer as the device formation substrate where the multilayer film is formed under the selected conditions for forming the epitaxial layer. The method for manufacturing a silicon epitaxial wafer according to the present invention will now be described hereinafter in detail.

Figure 1:
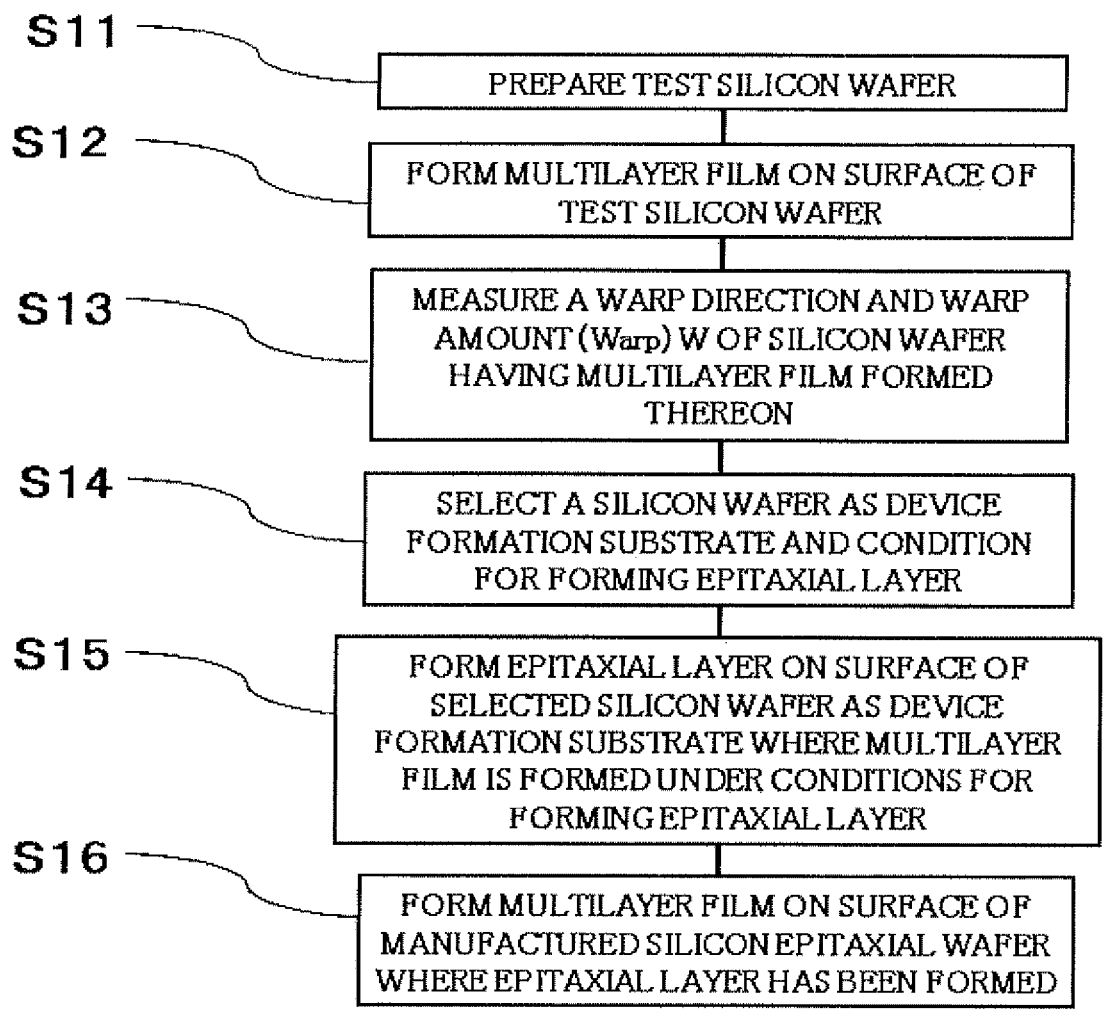
FIG. 1 is a flowchart showing an example of a method for manufacturing a semiconductor device using a silicon epitaxial wafer manufactured by a method for manufacturing a silicon epitaxial wafer according to the present invention.
Figure 2:
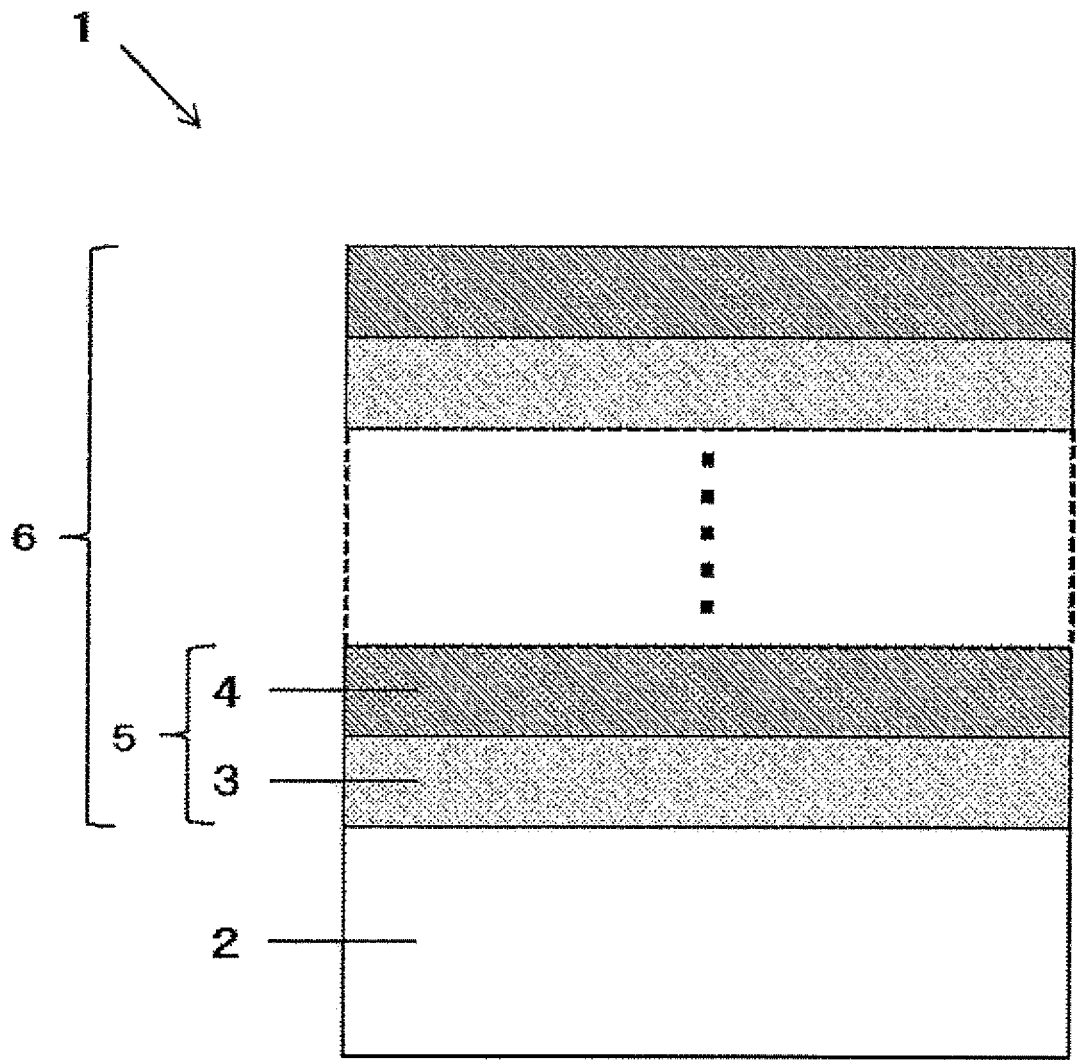
FIG. 2 is a schematic view showing a state where a multilayer film is laminated on a silicon wafer (a silicon substrate) in a process of a 3D-NAND device.

FIG. 1 is a flowchart showing an example of a method for manufacturing a semiconductor device using a silicon epitaxial wafer manufactured by a method for manufacturing a silicon epitaxial wafer according to the present invention.

First, a test silicon wafer is prepared in advance (see a step S11 in FIG. 1). Although this test silicon wafer is not restricted in particular, it is preferable to use a silicon wafer with less warp (for example, Warp is as very small as approximately several μm) so that a later-described warp amount (Warp) W can be easily measured.

Then, a multilayer film is formed on a surface of the test silicon wafer (see a step S12 in FIG. 1). This multilayer film is preferably a multilayer film provided by alternately laminating $SiO_2$ films and SiN films or a multilayer film provided by alternately laminating $SiO_2$ films and polysilicon (poly-Si) films.

Then, a step of measuring a warp direction and a warp amount (Warp) W of the silicon wafer having the multilayer film formed thereon is carried out (see a step S13 in FIG. 1). It is to be noted that a description of the warp direction of the silicon wafer having the multilayer film formed thereon will be given on the condition that a concave shape is provided in case of forming a concave warp which recesses the multilayer film side and a convex shape is provided in case of forming a convex warp which protrudes the multilayer film side.

Then, conditions for a silicon wafer which is a device formation substrate and for forming an epitaxial layer which is formed on the silicon wafer as the device formation substrate are selected so that a warp which cancels out the measured warp amount W is formed in a direction opposite to the measured warp direction (see a step S14 in FIG. 1).

As the silicon wafer which is the device formation substrate to be selected here, for example, a silicon wafer having an element, whose covalent radius is different from that of silicon, doped therein can be selected.

To reduce failures caused due to a warp in a multilayer process, using a wafer which warps in a shape opposite to a warp in the process enables reducing the warp after film formation. Specifically, when the warp in the process is the concave shape, the wafer to be used (the silicon epitaxial wafer) in the initial state is formed into the convex shape which is opposite to the concave shape (namely, a convex warp which protrudes the epitaxial layer side is formed). When the convex warp which protrudes the epitaxial layer side is formed to the silicon epitaxial wafer, it is preferable to use a silicon wafer having phosphorus or boron doped therein as the silicon wafer which is the device formation substrate. For example, when a silicon wafer having boron doped therein at high concentration is used as the silicon wafer which is the device formation substrate, a misfit is produced between a lattice constant of the epitaxial layer (a usual resistivity) and a lattice constant of the silicon wafer having boron doped therein, film stress is produced in the epitaxial layer, and a warp which protrudes the epitaxial layer side is formed to the silicon epitaxial wafer. It has been known that, since boron has a smaller covalent radius than that of silicon, the epitaxial layer side of the silicon epitaxial wafer using the silicon wafer having boron added thereto at high concentration warps into the convex shape.

On the other hand, when the convex warp is formed in the multilayer process, forming the wafer to be used into the concave shape in the initial state (namely, forming the concave warp which recesses the epitaxial layer side) enables reducing warp failures in the process. In case of forming the concave warp which recess the epitaxial layer side to the silicon epitaxial wafer, this formation can be realized by using a silicon wafer in which a large amount of an element with a larger covalent radius than that of silicon has been doped as the silicon wafer which is the device formation substrate. For example, it is preferable to use a silicon wafer having germanium or tin doped therein as the silicon wafer which is the device formation substrate.

It is to be noted that, to select the silicon wafer as the device formation substrate and conditions for forming the epitaxial layer which is formed on the silicon wafer as the device formation substrate, it is preferable to determine the conditions for the silicon wafer as the device formation substrate and conditions for forming the epitaxial layer by using the following expression in such a manner that a warp amount of a warp formed to the silicon epitaxial wafer becomes the warp amount W (in this regard, W is a positive value when a concave warp which recesses the multilayer film side is formed to the silicon wafer having the multilayer film formed thereon, and W is a negative value when a convex warp which protrudes the multilayer film side is formed to the silicon wafer having the multilayer film formed thereon).

$$W = \{(3 \times l^2 \times h_f)/(4 \times h_S^2)\} \times \{(r_{Si} - r_X)/r_{Si}\} \times [X]/N_S$$

where l: a diameter of the silicon wafer as the device formation substrate,
$h_f$: a thickness of the epitaxial layer,
$h_S$: a thickness of the silicon wafer as the device formation substrate,
$r_{Si}$: a covalent radius of Si,
$r_X$: a covalent radius of an element which is doped in the silicon wafer as the device formation substrate,
$N_S$: atomic density of Si, and
[X]: dope concentration of the element which is doped in the silicon wafer as the device formation substrate.

Although a method for determining the conditions for the silicon wafer which is the device formation substrate and the conditions for forming the epitaxial layer with the use of the above expression is not restricted in particular, but there is a method for substituting the measured warp amount W in the expression, setting constants to l, $h_S$, $r_{Si}$, $r_X$, and $N_S$, setting variables to $h_f$ (the thickness of the epitaxial layer) and [X] (the dope concentration of the element to be doped in the silicon wafer as the device formation substrate), and then determining the conditions. In this case, the dope concentration of the element to be doped in the silicon wafer which is the device formation substrate is lowered as the thickness of the epitaxial layer increases.

It is to be noted that the above expression can be derived by calculating the following expression.

$$\text{Warp} = \frac{l^2}{8R} \qquad \text{[Expression 1]}$$
$$= \frac{l^2}{8} \times \frac{6}{M_{Si} h_s^2} \sigma_f h_f$$

wherein l, $h_S$, and $h_f$ are the same as those described above, and $\sigma_f$ and $M_{Si}$ are represented by the following expression, $$\sigma_f = M_{Si} \frac{r_{si} - r_X}{r_{si}} \times \frac{[X]}{N_s} \qquad \text{[Expression 2]}$$

wherein $r_{Si}$, $r_X$, [X], and $N_S$ are the same as those described above, and $M_{Si}$ is represented by the following expression, $$M_{Si} = \frac{E_{Si}}{1 - v_{Si}} \qquad \text{[Expression 3]}$$

wherein $E_{Si}$ represents a Young's modulus of Si, and $v_{Si}$ represents a Poisson's ratio of Si.

It is to be note that setting the warp amount of the warp formed to the silicon epitaxial wafer to be equal to the warp amount W is desirable, but a yield in the device process can be enhanced as long as the warp caused at the time of forming the multilayer film on the surface of the silicon epitaxial wafer where the epitaxial layer has been formed is canceled out and reduced and the warp caused at the time of forming the multilayer film can be improved even if both the warp amounts are not completely equal to each other.

Then, a step of forming the epitaxial layer on the surface of the selected silicon wafer as the device formation substrate where the multilayer film is formed is carried out under the selected conditions for forming the epitaxial layer (see a step S15 in FIG. 1), thereby manufacturing the silicon epitaxial wafer. A composition of the epitaxial layer to be formed can be, e.g., silicon.

Thereafter, the multilayer film is formed on the surface of the manufactured silicon epitaxial wafer where the epitaxial layer has been formed (see a step S16 in FIG. 1). The multilayer film formed on the epitaxial layer may be a multilayer film which is the same as the multilayer film formed on the surface of the test silicon wafer at the step S12.

A semiconductor device can be manufactured as described above.

As described above, according to the method for manufacturing a silicon epitaxial wafer of the present invention, it is possible to manufacture the silicon epitaxial wafer whose warp caused in formation of the multilayer film can be reduced. Further, according to the method for manufacturing a semiconductor device of the present invention, since the warp caused at the time of forming the multilayer film on the surface of the silicon epitaxial wafer where the epitaxial layer has been formed can be reduced, subsequent processes are carried out in a state where the warp is small, and hence a semiconductor device can be manufactured without causing device failures.

EXAMPLES

Although the present invention will now be more specifically described hereinafter with reference to the examples, the present invention is not restricted thereto.

Example 1

First, a test silicon wafer (an epitaxial layer is not formed) was used, and a warp direction and a warp amount at a step of laminating "SiO$_2$+SiN" films (a multilayer film step) which is a first laminating step in a 3D-NAND device were actually measured. As the test silicon wafer, specifically, a p-type silicon wafer which has very small warp (several μm), a diameter of 300 mm, and a resistivity of 10 Ω·cm was used.

1 to 20 pairs of "SiO$_2$+SiN" films were laminated on this test silicon wafer. Film forming conditions for each film were conditions simulating actual processes. The SiO$_2$ films were formed by TEOS (a film forming temperature: 380° C.), and the SiN films were formed by low pressure CVD (SiH$_4$: 40 sccm, NH$_3$: 2000 sccm, a pressure: 250 to 300 torr). Each of all the layers had a thickness of 25 nm.

Figure 3:
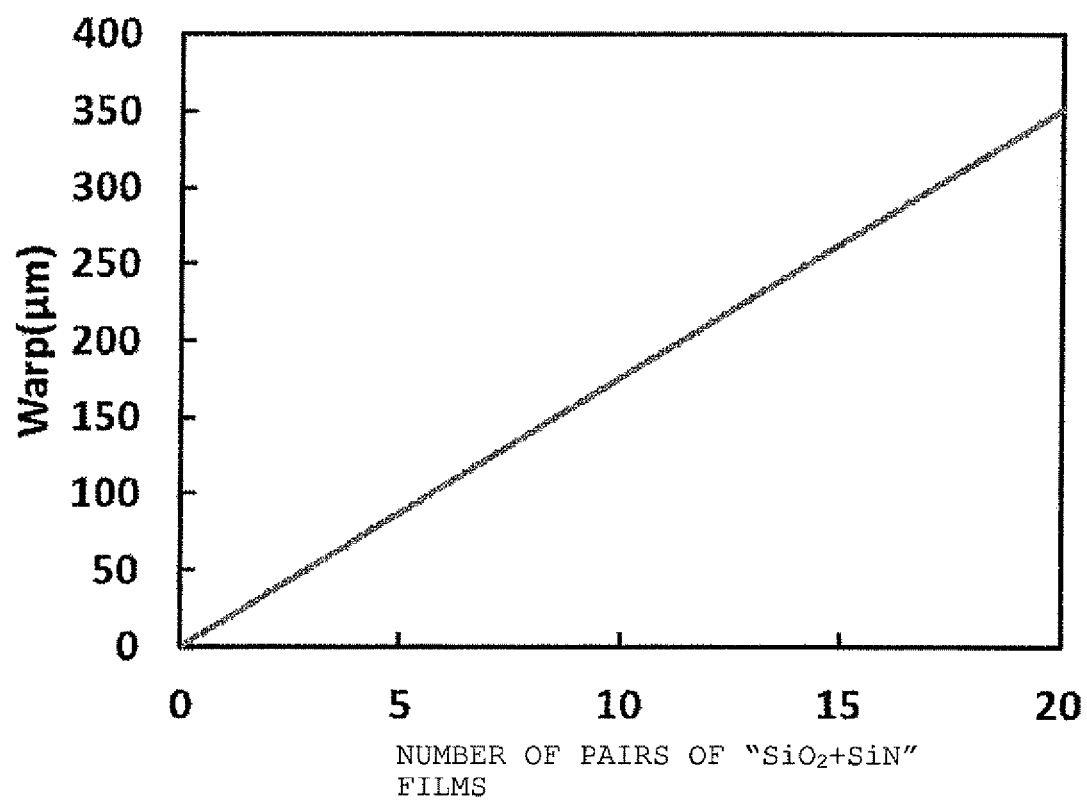
FIG. 3 is a graph showing a relationship between the number of pairs of "$SiO_2$+SiN" films to be laminated and Warp in a test silicon wafer according an example.

Then, warp of the silicon wafer having the "SiO$_2$+SiN" films formed thereon after the film formation was evaluated by an electrostatic capacitance type measuring instrument, and it is shown in FIG. 3. As shown in FIG. 3, Warp rose as the number of pairs of "SiO$_2$+SiN" films to be laminated increased as a consequence. Furthermore, the silicon wafer having the "SiO$_2$+SiN" films formed thereon had a shape which is recessed on the "SiO$_2$+SiN" film side.

Moreover, conditions for a silicon wafer as a device formation substrate and conditions for forming an epitaxial layer were estimated from the following expression so that a warp which cancels out the measured Warp amount can be formed in an direction opposite to the measured warp direction. It is to be noted that, as the silicon wafer which is the device formation substrate, a silicon wafer having boron doped therein was used. The silicon epitaxial wafer using the silicon wafer having boron added therein at high concentration as the silicon wafer which is the device formation substrate warps in such a manner that the epitaxial layer side protrudes due to a lattice mismatch between the silicon wafer having boron added thereto and the epitaxial layer, and hence a warp amount caused at the time of forming a multilayer film structure of the "SiO$_2$+SiN" films can be reduced.

$$W=\{(3\times l^2\times h_f)/(4\times h_S^2)\}\times\{(r_{Si}-r_X)/r_{Si}\}\times[X]/N_S$$

where l: a diameter of the silicon wafer as the device formation substrate,
$h_f$: a thickness of the epitaxial layer,
$h_S$: a thickness of the silicon wafer as the device formation substrate,
$r_{Si}$: a covalent radius of Si,
$r_X$: a covalent radius of an element which is doped in the silicon wafer as the device formation substrate,
$N_S$: atomic density of Si, and
[X]: dope concentration of the element which is doped in the silicon wafer as the device formation substrate.

Figure 4:
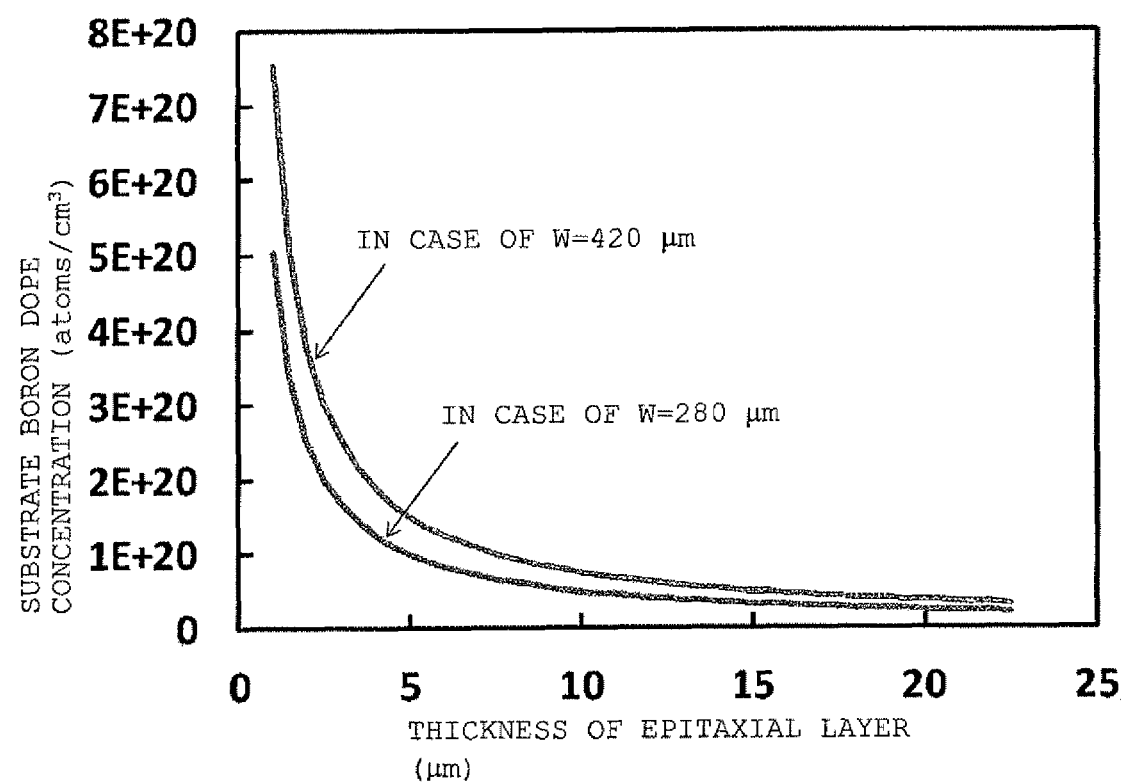
FIG. 4 is a graph showing a correlation between a thickness of an epitaxial layer and substrate boron doping concentration calculated in the example.

Then, conditions for the silicon wafer as the device formation substrate and conditions for forming the epitaxial layer to cancel out Warp of approximately 280 μm provided at the time of laminating 16 pairs of "SiO$_2$+SiN" films were calculated from the above Expression. W=280 μm was substituted in the above expression, and variables were set to the substrate boron dope concentration ([X]) and the thickness of the epitaxial layer ($h_f$). Additionally, as regards other factors, l: 300 mm, $h_s$: 775 μm, $r_{Si}$: 1.17 Å, $r_X$: 0.88 Å, and $N_S$: 5×10$^{22}$ atoms/cm$^3$ were set. FIG. 4 shows a relationship between the substrate boron dope concentration and the thickness of the epitaxial layer in this case. In this case, the concentration of boron which must be doped in the substrate decreases as the thickness of the epitaxial layer increases. The silicon epitaxial layer manufactured under such conditions can cancel out a warp which is caused when 16 pairs of "SiO$_2$+SiN" films are laminated on the epitaxial layer. It is to be noted that, as to conditions for the silicon wafer as the device formation substrate and conditions for forming the epitaxial layer to cancel out Warp (W=420 μm) corresponding to a case where 24 pairs of "SiO$_2$+SiN" films are laminated, values of l, $h_s$, $r_{Si}$, $r_X$, and $N_S$ were set to the same values as those described above to perform the calculation, and a relationship between the substrate boron dope concentration and the thickness of the epitaxial layer is also shown in FIG. 4.

On the basis of a graph when W=280 μm in FIG. 4, the thickness ($h_f$) of the epitaxial layer was set to 5 μm, the substrate boron dope concentration ([X]) was set to 1×10$^{20}$ atoms/cm$^3$, and the epitaxial layer was formed on the surface of the selected silicon wafer as the device formation substrate where the multilayer film is formed under the selected conditions for forming the epitaxial layer, thereby manufacturing the silicon epitaxial wafer. It is to be noted that a composition of the epitaxial layer was silicon.

Figure 5:
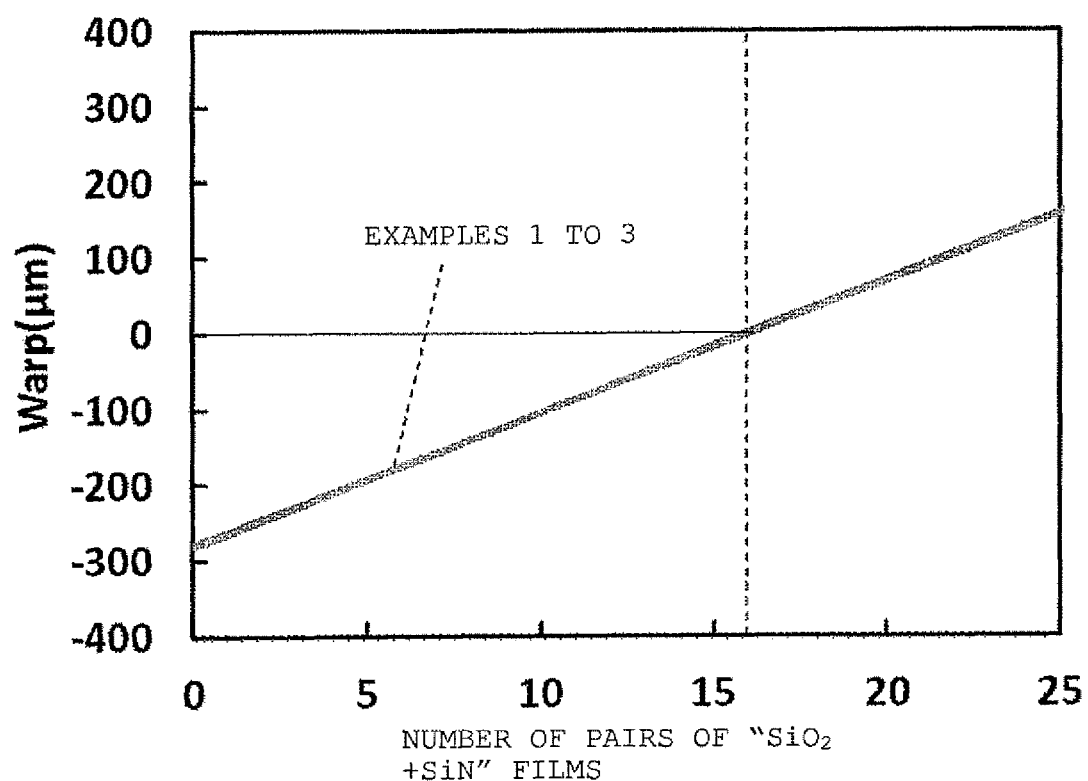
FIG. 5 is a graph showing a relationship between the number of pairs of "$SiO_2$+SiN" films to be laminated and Warp in a silicon epitaxial wafer according to each of Examples 1 to 3.

The "SiO$_2$+SiN" films were formed on the epitaxial layer of the thus manufactured silicon epitaxial wafer, and a relationship between the number of pairs of formed "SiO$_2$+SiN" films and a value of Warp of the silicon epitaxial wafer is shown in FIG. 5. It is to be noted that, a warp shape of the silicon epitaxial wafer is a convex shape on the epitaxial layer side when the value of warp in FIG. 5 is negative, and the warp shape of the silicon epitaxial wafer is a concave shape on the epitaxial layer side when the same is positive.

Example 2

A silicon epitaxial wafer was manufactured in the same manner as Example 1 except that a thickness ($h_f$) of an epitaxial layer was set to 10 μm and substrate boron dope concentration ([X]) was set to 5×10$^{19}$ atoms/cm$^3$, and "SiO$_2$+SiN" films were formed on the epitaxial layer. A relationship between the number of pairs of formed "SiO$_2$+SiN" films and a value of Warp of the silicon epitaxial layer is shown in FIG. 5.

Example 3

A silicon epitaxial wafer was manufactured in the same manner as Example 1 except that a thickness (h$_f$) of an epitaxial layer was set to 15 μm and substrate boron dope concentration ([X]) was set to 3×10$^{19}$ atoms/cm$^3$, and "SiO$_2$+SiN" films were formed on the epitaxial layer. A relationship between the number of pairs of formed "SiO$_2$+SiN" films and a value of Warp of the silicon epitaxial layer is shown in FIG. 5.

The conditions in Examples 1 to 3 are all conditions which can cancel out the warp when the 16 pairs of "SiO$_2$+SiN" films are laminated. Actually, as shown in FIG. 5, in has been understood that, in the silicon epitaxial wafer manufactured under the conditions of each of Examples 1 to 3, warp becomes substantially 0 when the 16 pairs of "SiO$_2$+SiN" films are laminated. It is to be noted that the three graphs each showing the relationship between the number of pairs of "SiO$_2$+SiN" films and the value of Warp in Examples 1 to 3 overlap as shown in FIG. 5.

It is to be noted that the present invention is not restricted to the foregoing embodiment. The foregoing embodiment is an illustrative example, and any example which has substantially the same structure and exerts the same functions and effects as the technical concept described in claims of the present invention is included in the technical scope of the present invention.

The invention claimed is:

1. A method for manufacturing a silicon epitaxial wafer which is constituted of a silicon wafer and an epitaxial layer formed on the silicon wafer, the silicon epitaxial wafer being configured to form a multilayer film on the epitaxial layer comprising:

preparing a test silicon wafer in advance, forming the multilayer film on a surface of the test silicon wafer, and measuring a warp direction and a warp amount W of the test silicon wafer having the multilayer film formed thereon; and selecting a silicon wafer as a device formation substrate and conditions for forming an epitaxial layer which is formed on the silicon wafer as the device formation substrate in such a manner that a warp which cancels out the measured warp amount W is formed in a direction opposite to the measured warp direction, and forming the epitaxial layer on a surface of the selected silicon wafer as the device formation substrate where the multilayer film is formed under the selected conditions for forming the epitaxial layer.

2. The method for manufacturing a silicon epitaxial wafer according to claim 1, wherein, at the step of forming the epitaxial layer, a silicon wafer having germanium or tin doped therein is used as the silicon wafer which is the device formation substrate in case of forming a concave warp which recesses the epitaxial layer side to the silicon epitaxial wafer, and a silicon wafer having phosphorus or boron doped therein is used as the silicon wafer which is the device formation substrate in case of forming a convex warp which protrudes the epitaxial layer side to the silicon epitaxial wafer.

3. The method for manufacturing a silicon epitaxial wafer according to claim 2, wherein, at the step of forming the epitaxial layer, conditions for the silicon wafer as the device formation substrate and the conditions for forming the epitaxial layer are determined by the following expression in such a manner that a warp amount of a warp formed to the silicon epitaxial wafer becomes the warp amount W, wherein, W is a positive value in case of forming a concave shape which recesses a multilayer film side to the silicon wafer having the multilayer film formed thereon, and W is a negative value in case of forming a convex warp which protrudes the multilayer film side to the silicon wafer having the multilayer film formed thereon:

$$W=\{(3\times l^2\times h_f)/(4\times h_S^2)\}\times\{(r_{Si}-r_X)/r_{Si}\}\times[X]/N_S$$

where l: a diameter of the silicon wafer as the device formation substrate, h$_f$: a thickness of the epitaxial layer, h$_s$: a thickness of the silicon wafer as the device formation substrate, r$_{Si}$: a covalent radius of Si, r$_X$: a covalent radius of an element which is doped in the silicon wafer as the device formation substrate, N$_S$: atomic density of Si, and

[X]: dope concentration of the element which is doped in the silicon wafer as the device formation substrate.

4. The method for manufacturing a silicon epitaxial wafer according to claim 3, wherein the multilayer film is a multilayer film provided by alternately laminating an SiO$_2$ film and an SiN film or a multilayer film provided by alternately laminating the SiO$_2$ film and a polysilicon film.

5. A method for manufacturing a semiconductor device, the method comprising forming the multilayer film on a surface of a silicon epitaxial wafer, which is manufactured by the method for manufacturing a silicon epitaxial wafer according to claim 4, where the epitaxial layer has been formed.

6. A method for manufacturing a semiconductor device, the method comprising forming the multilayer film on a surface of a silicon epitaxial wafer, which is manufactured by the method for manufacturing a silicon epitaxial wafer according to claim 3, where the epitaxial layer has been formed.

7. The method for manufacturing a silicon epitaxial wafer according to claim 2, wherein the multilayer film is a multilayer film provided by alternately laminating an SiO$_2$ film and an SiN film or a multilayer film provided by alternately laminating the SiO$_2$ film and a polysilicon film.

8. A method for manufacturing a semiconductor device, the method comprising forming the multilayer film on a surface of a silicon epitaxial wafer, which is manufactured by the method for manufacturing a silicon epitaxial wafer according to claim 7, where the epitaxial layer has been formed.

9. A method for manufacturing a semiconductor device, the method comprising forming the multilayer film on a surface of a silicon epitaxial wafer, which is manufactured by the method for manufacturing a silicon epitaxial wafer according to claim 2, where the epitaxial layer has been formed.

10. The method for manufacturing a silicon epitaxial wafer according to claim 1, wherein, at the step of forming the epitaxial layer, conditions for the silicon wafer as the device formation substrate and the conditions for forming the epitaxial layer are determined by the following expression in such a manner that a warp amount of warp formed to the silicon epitaxial wafer becomes the warp amount W, wherein, W is a positive value in case of forming a concave shape which recesses a multilayer film side to the silicon wafer having the multilayer film formed thereon, and W is a negative value in case of forming a convex warp which protrudes the multilayer film side to the silicon wafer having the multilayer film formed thereon;

$$W = \{(3 \times l^2 \times h_f)/(4 \times h_S^2)\} \times \{(r_{Si} - r_X)/r_{Si}\} \times [X]/N_S$$

where l: a diameter of the silicon wafer as the device formation substrate,
$h_f$: a thickness of the epitaxial layer,
$h_S$: a thickness of the silicon wafer as the device formation substrate,
$r_{Si}$: a covalent radius of Si,
$r_X$: a covalent radius of an element which is doped in the silicon wafer as the device formation substrate,
$N_S$: atomic density of Si, and
[X]: dope concentration of the element which is doped in the silicon wafer as the device formation substrate.

11. The method for manufacturing a silicon epitaxial wafer according to claim 10,
wherein the multilayer film is a multilayer film provided by alternately laminating an $SiO_2$ film and an SiN film or a multilayer film provided by alternately laminating the $SiO_2$ film and a polysilicon film.

12. A method for manufacturing a semiconductor device, the method comprising forming the multilayer film on a surface of a silicon epitaxial wafer, which is manufactured by the method for manufacturing a silicon epitaxial wafer according to claim 11, where the epitaxial layer has been formed.

13. A method for manufacturing a semiconductor device, the method comprising forming the multilayer film on a surface of a silicon epitaxial wafer, which is manufactured by the method for manufacturing a silicon epitaxial wafer according to claim 10, where the epitaxial layer has been formed.

14. The method for manufacturing a silicon epitaxial wafer according to claim 1,
wherein the multilayer film is a multilayer film provided by alternately laminating an $SiO_2$ film and an SiN film or a multilayer film provided by alternately laminating the $SiO_2$ film and a polysilicon film.

15. A method for manufacturing a semiconductor device, the method comprising forming the multilayer film on a surface of a silicon epitaxial wafer, which is manufactured by the method for manufacturing a silicon epitaxial wafer according to claim 14, where the epitaxial layer has been formed.

16. A method for manufacturing a semiconductor device, the method comprising forming the multilayer film on a surface of a silicon epitaxial wafer, which is manufactured by the method for manufacturing a silicon epitaxial wafer according to claim 1, where the epitaxial layer has been formed.

\* \* \* \* \*